United States Patent [19]
Bill et al.

[11] Patent Number: 5,754,475
[45] Date of Patent: May 19, 1998

[54] BIT LINE DISCHARGE METHOD FOR READING A MULTIPLE BITS-PER-CELL FLASH EEPROM

[75] Inventors: Colin Bill, Cupertino; Ravi Gutala, Sunnyvale; Qimeng (Derek) Zhou, Sunnyvale; Jonathan Su, Sunnyvale, all of Calif.

[73] Assignee: Advanced Micro Devices, Inc., Sunnyvale, Calif.

[21] Appl. No.: 884,547

[22] Filed: Jun. 27, 1997

Related U.S. Application Data

[63] Continuation of Ser. No. 668,795, Jun. 24, 1996, abandoned.
[51] Int. Cl.$^6$ ................................................. G11C 11/34
[52] U.S. Cl. ................................. 365/185.25; 365/185.2
[58] Field of Search ........................... 365/185.21, 185.2, 365/185.09, 185.25

[56] References Cited

U.S. PATENT DOCUMENTS

| | | | |
|---|---|---|---|
| 5,029,135 | 7/1991 | Okubo | 365/203 |
| 5,157,626 | 10/1992 | Watanabe | 365/185.2 |
| 5,258,958 | 11/1993 | Iwahashi et al. | 365/185.09 |
| 5,386,132 | 1/1995 | Wong | 365/185.29 |
| 5,532,962 | 7/1996 | Auclair et al. | 365/185.09 |

FOREIGN PATENT DOCUMENTS

| | | |
|---|---|---|
| 0358310 | 5/1990 | European Pat. Off. . |
| 0756287 | 1/1997 | European Pat. Off. . |

*Primary Examiner*—David C. Nelms
*Assistant Examiner*—Michael T. Tran
*Attorney, Agent, or Firm*—Davis Chin

[57] ABSTRACT

An improved reading structure (110) for performing a read operation in an array of multiple bits-per-cell flash EEPROM memory cells is provided. A memory core array (12) includes a plurality of memory cells, each being previously programmed to one of a plurality of memory conditions defined by memory core threshold voltages. A reference cell array (22) includes a plurality of reference core cells which are selected together with a selected core cell and provides selectively one of a plurality of reference cell bit line voltages defined by reference cell threshold voltages. Each of the reference cells are previously programmed at the same time as when the memory core cells are being programmed. A precharge circuit (36) is used to precharge the array bit lines and the reference bit lines to a predetermined potential. A detector circuit (28) is responsive to the bit line voltages of the reference cells for generating strobe signals. A reading circuit (26) is responsive to the strobe signals for comparing the memory core threshold voltage with each of the reference cell threshold voltages.

9 Claims, 3 Drawing Sheets

BIT LINE DISCHARGE METHOD FOR READING A MULTIPLE BITS-PER-CELL FLASH EEPROM

This application is a continuation of application Ser. No. 08/668,795, filed Jun. 24, 1996, abandoned.

BACKGROUND OF THE INVENTION

1. Field of the Invention

This invention relates generally to floating gate memory devices such as an array of flash electrically, erasable programmable read-only memory (EEPROM) cells. More particularly, it relates to a semiconductor integrated circuit memory device having an improved reading scheme for performing a read operation in an array of two bits-per-cell flash EEPROM memory cells so as to render enhanced efficiency.

2. Description of the Prior Art

As is generally known in the art, a new category of electrically erasable EPROMs/EEPROMs has emerged in recent years as an important non-volatile memory which combines the advantages of EPROM density with EEPROM electrical erasability and is sometimes referred to as "Flash" EPROM or EEPROM. In these conventional (single density) flash memory devices, a plurality of one-transistor flash EEPROM core cells may be formed on a semiconductor substrate in which each cell is comprised of a P-type conductivity substrate, an N-type conductivity source region formed integrally with the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

In order to program the flash EEPROM cell in conventional operation, the drain region and the control gate are raised to predetermined potentials above the potential applied to the source region. For example, the drain region has applied thereto a voltage $V_D$ of approximately +5.5 volts with the control gate $V_G$ having a voltage of approximately +12 volts applied thereto. These voltages produce "hot electrons" which are accelerated across the thin dielectric layer and onto the floating gate. This hot electron injection results in an increase of the floating gate threshold by approximately two to four volts.

For erasing the flash EEPROM cell in conventional operation, a positive potential (e.g., +5 volts) is applied to the source region. The control gate is at a negative potential (e.g., −8 volts), and the drain region is allowed to float. A strong electric field develops between the floating gate and the source region, and a negative charge is extracted from the floating gate to the source region by way of Fowler-Nordheim tunneling.

In order to determine whether the flash EEPROM cell has been properly programmed or not, the magnitude of the read current is measured. Typically, in the read mode of operation the source region is held at a ground potential (0 volts) and the control gate is held at a potential of about +5 volts. The drain region is held at a potential between +1 to +2 volts. Under these conditions, an unprogrammed cell (storing a logic "1") will conduct a current level of approximately 50 to 100 uA. The programmed cell (storing a logic "0") will have considerably less current flowing.

These flash memory core cells are typically manufactured in the form of an N×M matrix or array on a single chip, where N equals the number of rows and M equals the number of columns. All of the individual core cells in the memory array are accessed by a row decoder and a column decoder so as to address a particular core cell. A sense amplifier is built in the semiconductor chip for sensing the memory state of the selected memory core cell when addressed by the row decoder and column decoder. In recent years, such flash memories are being fabricated with progressively higher and higher bit densities and smaller cell sizes as the density of semiconductor integrated circuit memories increases. For example, memory devices having 16 megabits (approximately 16 million memory cells) density or more are now being mass produced.

As the demand for the use of these flash memories continues to increase as a media for mass storage, there has arisen a need for further reducing the cost-per-bit of such flash memories. In order to achieve this requirement, there has now been developed more recently a class of flash memories with multi-level cells so as to significantly reduce the memory per-bit cost. A discussion pertaining to the operation and structure of such a prior art flash memory may be found in 1995 IEEE International Solid-State Circuits Conference, Feb. 16, 1995, pp. 132–133 in an article entitled "A Multilevel-Cell 32 Mb Flash Memory" by M. Bauer et al., the disclosure of this article being incorporated herein by reference. Reference is also made to another article by Shin-ichi Kobayashi et al. entitled "A 3.3 V-Only 16 Mb DINOR Flash Memory," which is found in 1995 IEEE International Solid-State Circuits Conference, Feb. 16, 1995, pp. 122–123.

In this prior art 32 Mb multilevel-cell flash memory, there is achieved a 32 Mb storage capacity using 16M flash memory cells by storing two bits of data per cell referred to as "double-density." The logical flash memory cell realizes this storage of two bits per cell through the use of four possible states, which are defined by four flash cell threshold voltage ranges. Further, threshold voltages of three read reference cells are placed in separation ranges between the four possible states. During the read operation, there are used two sense amplifiers so as to compare the array cell with the threshold voltage of the three read reference cells.

A number of drawbacks may be associated with the way the multilevel-cell flash memory is read. First, because the read reference cell voltages are fixed and are generated generally away from the memory core array, the difference in current between a selected core cell in one of the four possible states and the reference currents becomes quite small, thereby creating a possible error in reading. A second drawback is due to the fact that a program disturb (i.e., the phenomenon that the unselected memory cells will have their threshold voltages changed during programming of the selected memory cells) will effect only the core cells and thus cause a mismatch between the core cells and the reference cells since there is no tracking of the threshold voltage shift therebetween.

In U.S. Pat. No. 5,172,338 to S. Mehrotra et al. issued on Dec. 15, 1992, there is disclosed an EEPROM array which includes circuits and techniques for read, write and erase so as to provide multiple threshold levels in order to allow for accurate reading and writing of more than two distinct states within each memory cell. This '338 patent is hereby incorporated by reference in its entirety. A set of threshold levels is provided by a corresponding set of reference cells, acting as a master reference, which closely tracks and makes adjustments for the variations presented by the memory cells. The master reference cells are independently and externally programmable, either by the memory manufacturer or the user through software control. During a read operation, the memory state of the memory cell is obtained by comparing the current flowing therethrough with that of the set of reference currents in the reference cells corresponding to multiple threshold breakpoint levels.

Nevertheless, there has arisen a need to provide an improved reading scheme for performing the reading operation in an array of two bits-per-cell flash EEPROM cells so as to render enhanced efficiency. The present invention represents a significant improvement over the aforementioned technical articles and U.S. Pat. No. 5,171,338.

SUMMARY OF THE INVENTION

Accordingly, it is a general object of the present invention to provide an improved read method for two bits-per-cell flash EEPROM cells which is relatively simple in its construction, easier to manufacture, and has enhanced accuracy over the prior art reading structures.

It is an object of the present invention to provide a semiconductor integrated circuit memory device having an improved reading scheme for performing a read operation in an array of two bits-per-cell flash EEPROM memory cells so as to render enhanced efficiency.

It is another object of the present invention to provide an improved read method for two bits-per-cell flash EEPROM memory cells which compensates for process variations and temperature changes.

It is still another object of the present invention to provide an improved read method for two bits-per-cell flash EEPROM memory cells in which the reference cell is programmed at the same time the memory core cell is being programmed, thereby guaranteeing a minimal Read margin.

It is yet still another object of the present invention to provide a bit line discharge method for performing a read operation in an array of two bits-per-cell flash EEPROM memory cells thereby minimizing mismatches between reference cells and core cells.

It is still yet another object of the present invention to provide for an improved tracking between any core cell and its reference cell after program/erase cycling, due to the core cell and its reference cell being programmed concurrently.

In accordance with a preferred embodiment of the present invention, there is provided an improved reading structure for performing a read operation in an array of multiple bits-per-cell flash EEPROM memory cells so as to render enhanced efficiency. The read structure includes a memory core array having a plurality of memory cells arranged in rows of wordlines and columns of bit lines intersecting the rows of wordlines. Each of the memory cells includes a floating gate array transistor. Each of the memory core cells is unprogrammed or programmable to one of a plurality of memory states defined by memory core threshold voltages. A row decoder is responsive to row address signals and is operatively connected to the memory core array for selecting certain ones of the rows of wordlines. A column decoder is responsive to column address signals and is operatively connected to the memory core array for selecting certain ones of the columns of bit lines. A reference cell array includes a plurality of reference core cells arranged in rows of wordlines corresponding to the number of rows in the memory core array and in columns of reference bit lines corresponding to the number of programmed memory core threshold voltages and which are selected together with a selected core cell and generating selectively one of a plurality of reference cell voltages defining reference cell thresholds. Each of the reference cells is unprogrammed or programmable to one of the plurality of reference cell voltages at the same time as the memory core cells are being unprogrammed or programmed to one of the plurality of memory core threshold voltages.

The read structure further includes a precharging circuit for sequentially precharging the selected array bit lines and one of the reference bit lines in the columns to a predetermined level. A detector circuit is used to generate strobe signals in response to the reference threshold voltages. A reading circuit is responsive to the strobe signals for comparing the memory cell threshold voltage of the selected memory core cells with each of the reference cell threshold voltages so as to determine which one of the plurality of memory states the selected memory core cell is storing.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

An improved read structure for performing a read operation in an array of two bits-per-cell flash EEPROM memory cells is described. In the following description, numerous specific details are set forth, such as specific circuit configurations, components, and the like in order to provide a thorough understanding of the present invention. However, it should be apparent to those skilled in the art that the present invention may be practiced without these specific details. In other instances, well-known processes, circuits, and control lines, not particularly relevant to the understanding of the operating principles of the present invention, have been purposely omitted for the sake of clarity.

Figure 1:
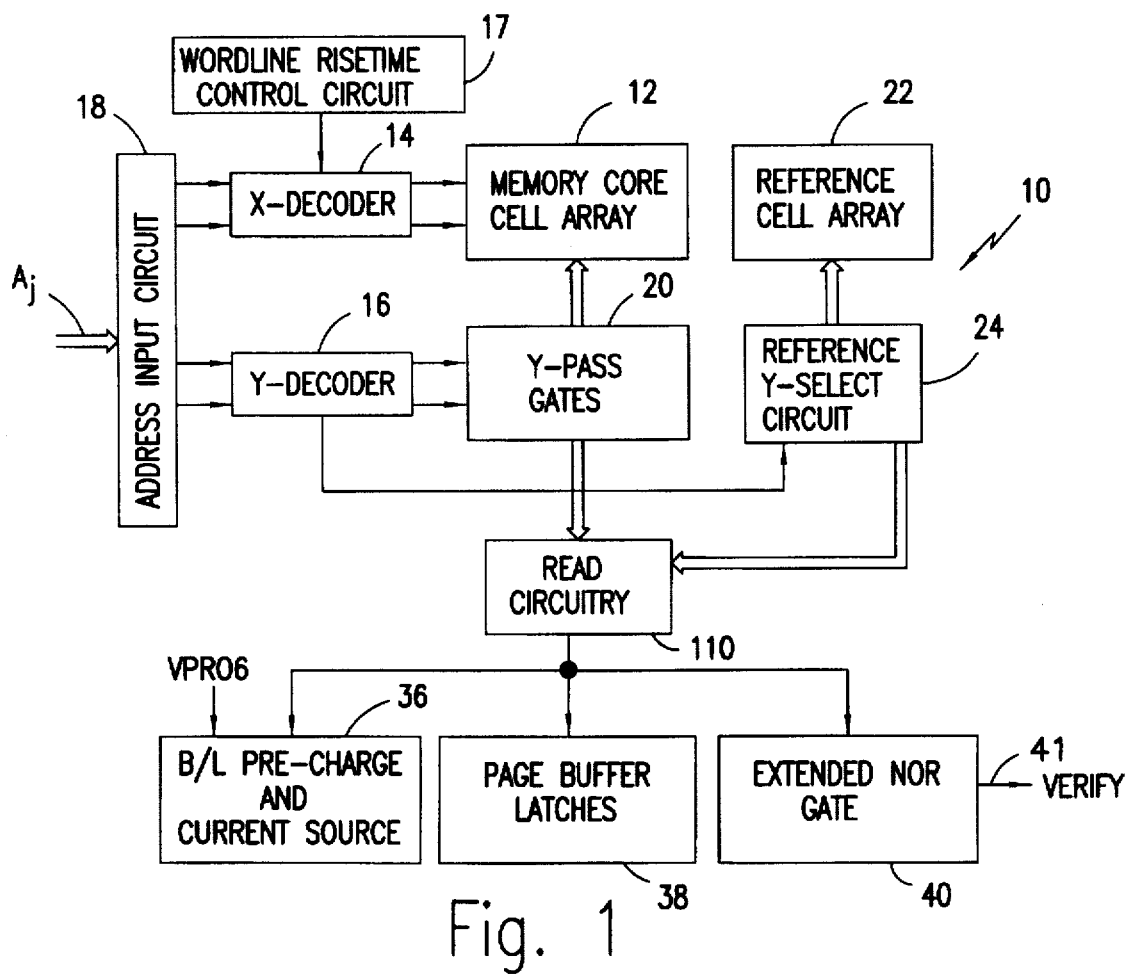
FIG. 1 is a block diagram of a two bits-per-cell semiconductor integrated circuit memory device having improved reading scheme, constructed in accordance with the principles of the present invention.

Referring now in detail to the drawings, there is shown in FIG. 1 a block diagram of a two bits-per-cell semiconductor integrated circuit memory device 10 which includes an improved reading structure of the present invention for performing a read operation in an array of two bits-per-cell flash electrically erasable read-only memory (EEPROM) cells of the memory device so as to render enhanced efficiency. The improved reading structure and the remaining portions of the memory device 10 are both wholly formed on a single semiconductor substrate by known CMOS integrated circuit technology.

The two bits-per-cell semiconductor integrated circuit memory device 10 includes a memory core cell array 12, a row address decoder 14, a column address decoder 16, a wordline risetime control circuit 17, an address input circuit 18, a Y-pass gate circuit 20, a reference cell array 22, and a reference Y-select circuit 24. The memory core cell array 12 includes approximately 16 million core cells arranged in a regular matrix pattern of $2^{12}$ rows and $2^{12}$ columns. Preferably, groups of columns are formed such that each group defines a page. Each page represents a number of bytes of data. For instance, the $2^{12}$ columns may be divided into four pages so that each page will contain 128 bytes (1024 bits) of data. Further, a predetermined number of rows may be grouped together so as to form a sector defining a selectable block. For example, the $2^{12}$ rows may be divided into 64 sectors so that each sector will be composed of 64 rows. Thus, each sector will contain 32K bytes (256K bits) of data. For the two bits-per-cell memory device 10, the 16 Mb flash memory cells can actually store 32 Mb of data since two bits of data per cell is being stored in order to provide a double density storing capacity. Hence, the effective sector size is 64K bytes.

Figure 2:
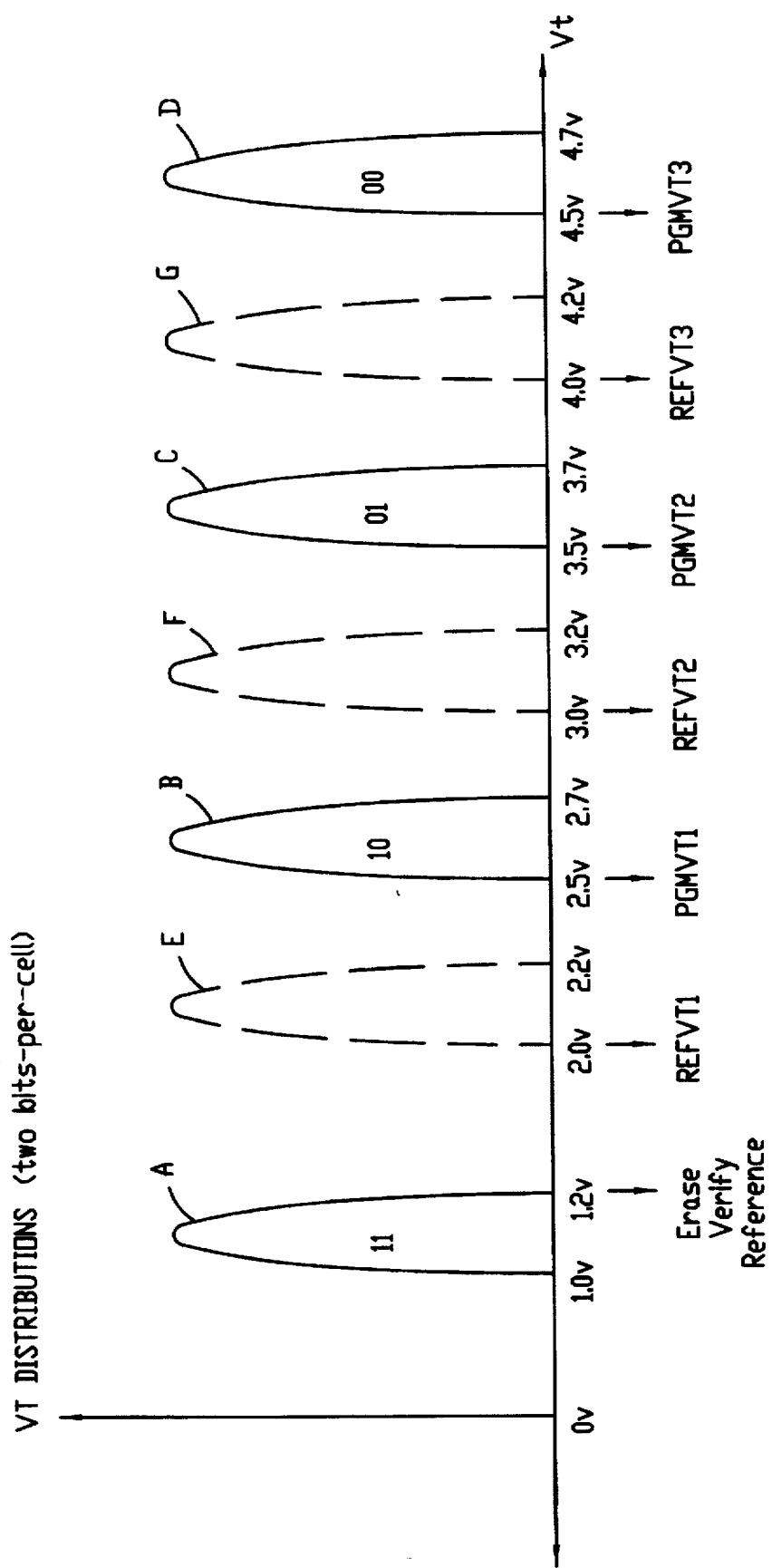
FIG. 2 is a graph of four memory states for a cell storing two bits-per-cell and the corresponding threshold voltage distributions for the three reference cells disposed therebetween.

By a programming operation, each of the memory core cells has its threshold voltage set to one of three higher levels with respect to its control gate than a memory core cell which is not programmed but set in the erased state. In FIG. 2, there is shown a graph of four threshold voltage $V_t$ distributions for the four possible states (three programmed states and an erased state) for the double density memory cells. As can be seen, the curve A shows the threshold voltage distribution for the memory core cells in the erased state or corresponding to storing data or logic "11." The erase verify reference voltage of the erased state is +1.2 V. The curve B shows the voltage distribution for the memory core cells in the first programmed state (PGMVT1) or corresponds to storing data or logic "10." The voltage PGMVT1 of the first programmed state is in the range between +2.5 V to +2.7 V. Similarly, the curve C shows the threshold voltage distribution for the memory core cells in the second programmed state (PGMVT2) or corresponding to storing data or logic "01." The voltage PGMVT2 of the second programmed state is in the range between +3.5 V to +3.7 V. Finally, the curve D shows the threshold voltage distribution for memory core cells in the third programmed state (PGMVT3) or corresponding to storing data or logic "00." The voltage PGMVT3 of the third programmed state is in the range between +4.5 V to +4.7 V.

The reference cell array 22 includes a plurality of sets of reference columns. Each column in the sets of reference columns has $2^{12}$ rows corresponding to the number of rows in the memory core cell array 12. Thus, there will be $2^{12}$ rows in each of the sets of reference columns. Further, the number of the plurality of sets of reference columns corresponds to the number of possible programmed memory states of the memory core cell. For the two bits-per-cell memory device 10, there will be three sets of reference columns. In addition, the three sets of reference columns are embedded and are associated with every page in the memory core array 12 with dedicated bit lines so that the reference column cells can be programmed and erased along with the remainder of the selected page. In particular, when the page is being programmed, 128 bytes are usually programmed in parallel. Therefore, three reference columns of reference core cells are also concurrently programmed when the memory core cells are being programmed.

Similarly, three threshold voltages for the reference columns are required to be set at intermediate states between adjacent memory states. As shown in FIG. 2, the curve E shows the threshold voltage distribution for the first reference level (REFVT1) in the first reference column. The voltage REFVT1 of the first reference level is in the range between +2.0 V to +2.2 V. Similarly, the curve F shows the threshold voltage distribution for the second reference level (REFVT2) in the second reference column. The voltage REFVT2 of the second reference level is in the range between +3.0 V to +3.2 V. Finally, the curve G shows the threshold voltage distribution for the third reference level (REFVT3) in the third reference column. The voltage REFVT3 of the third reference level is in the range between +4.0 V to +4.2 V.

As a result, the memory cell has the capability of storing two bits of data depending upon the value of the memory core threshold voltages. Likewise, the reference core cells has a reference level dependent upon the value of the reference threshold voltage. As will be noted, the threshold voltages for the respective curves A through D for each of the memory core cells of the two bits-per-cell flash memory device are not all identical to the threshold voltages on all other memory cells but varies in a typical Gausian or bell-shaped distribution. Likewise, the respective curves E through G are also in the form of a bell-shaped curve. The simultaneous programming of the memory core cells and the reference core cells is described and illustrated in co-pending application Ser. No. 08/635,995 filed Apr. 22, 1996 and entitled "A Method for Page Mode Programming Multiple Bits-Per-Cell Flash EEPROM" which is assigned to the same assignee as the present invention.

Address signals $A_j$ are externally applied to the address input circuit 18. The row address signals from the address input circuit 18 are fed to the row address decoder 14, and the column address signals thereof are fed to the column address decoder 16. The row address decoder 14 selects certain ones of the plurality of word-lines in the memory core cell array 12 in response to the row address signals. The column address decoder 16 selects one of the pages in the memory core array in response to the column address signals as well as the corresponding sets of reference columns associated with the selected page. The Y-pass gate circuit 20 connects the corresponding array bit lines in the selected page with a read circuitry 110. The reference column select circuit 24 sequentially selects and connects each of the corresponding reference bit lines of the reference cell array associated with the selected pages to the read circuitry 110.

Figure 3:
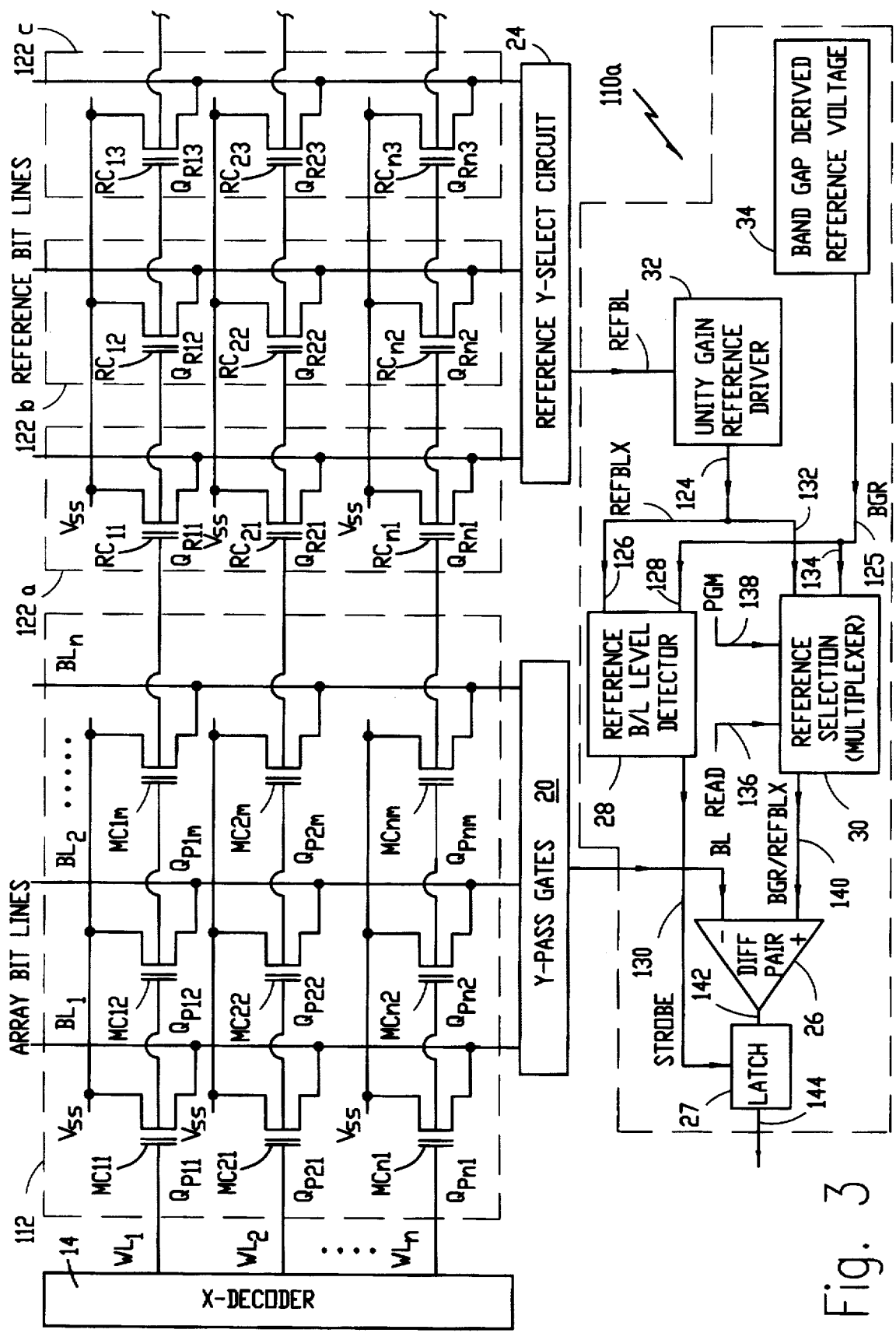
FIG. 3 is a simplified block diagram of the read circuitry 110 of FIG. 1.

In FIG. 3, there is illustrated a simplified block diagram of a portion of the read circuitry 100a in FIG. 1 for use with one page (i.e., $WL_1$ of array 112) of the memory core array 12 with associated reference columns 122a, 122b and 122c of the reference cell array 22. As can be seen, the memory core cells MC11 through MCnm of the array 112 are arranged in the form of a matrix. The core cells MC11, MC12, ... MC1m are arranged in the same row and have their selection terminals connected to the same common wordline $WL_1$. Similarly, the memory core cells MC21, MC22, ... MC2m are arranged in the same row and have their selection terminals connected to the common wordline $WL_2$. This is likewise done for each of the remaining rows in the block 112. Finally, the memory core cells MCn1, MCn2, ... MCnm are arranged in the same row and have their selection terminals connected to the common wordline WLn. Also, the core cells MC11, MC21, ... MCn1; the core cells MC12, MC22, ... MCn2; ... and the core cells MC1m, MC2m, ... MCnm are arranged in the same respective columns and have their corresponding data terminals connected to associated common bit lines $BL_1$, $BL_2$, ... $BL_n$, respectively. The number n is equal to 64 for a sector, and the number m is equal to 1024 for a page containing 256 bytes of two bits-per-cell data.

Each of the memory core cells MC11 through MCnm is comprised of one of the corresponding array floating gate transistors $Q_{p11}$–$Q_{pnm}$. The array transistors $Q_{p11}$–$Q_{pnm}$ function as a memory transistor for storing data or logic levels "11," "10," "01," or "00" therein. Each of the array transistors has its gate connected to one of the rows of wordlines, its source connected to one of the columns of bit lines, and its drain connected to a page common array ground line VSS.

The reference column 122a is comprised of a plurality of reference cells $RC_{11}$, $RC_{21}$, ... $RC_{n1}$. Each of the reference cells $RC_{11}$–$RC_{n1}$ is comprised of one of the corresponding reference cell transistors $Q_{R11}$–$Q_{Rn1}$. Similarly, the reference column 122b is comprised of a plurality of reference cells $RC_{12}$, $RC_{22}$, ... $RC_{n2}$. Each of the reference cells $RC_{12}$–$RC_{n2}$ is comprised of one of the corresponding reference cell transistors $Q_{R12}$–$Q_{Rn1}$. Finally, the reference column 122c is comprised of a plurality of reference cells $RC_{13}$, $RC_{23}$, ... $RC_{n3}$. Each of the reference cells $RC_{13}$–$RC_{n3}$ is comprised of one of the corresponding reference cell transistors $Q_{R13}$–$Q_{Rn3}$. The gates of the array transistors and the reference cell transistors located in the same row in the page are connected to the same wordline. For example, the gates of the array transistors $Q_{P11}$, $Q_{P12}$, ... $Q_{P1m}$ and the gates of the reference cell transistors $Q_{R11}$, $Q_{R12}$, and $Q_{R13}$ are connected to the wordline $WL_1$.

During the page mode programming of the two bits-per-cell memory core array 12, three reference cell transistors associated with the memory array core cells being programmed are also concurrently programmed. Thus, each of the three reference cell transistors is programmed to a different reference threshold level, each being programmed to have a reference level between two of the adjacent actual program states of the array core cell. With reference again to FIG. 2, it can be seen that a first reference core cell is set to a first reference level REFVT1 (curve E) located between the program logic level "10" and the erased logic level "11." Similarly, a second reference core cell is set to a reference voltage level REFVT2 (curve F) located between the program logic levels "01" and "10." Finally, a third reference core cell is set to a reference voltage level REFVT3 located between the program levels "00" and "01."

The improved read circuitry 110a is essentially comprised of a differential pair amplifier 26, a latch 27, a reference bit line level detector 28, a reference selection circuit 30, a unity gain reference driver 32, and a bandgap reference generator 34. As can be seen, the unity gain reference driver 32 has its input connected to a common reference bit line REFBL and has its output on line 124 for providing a reference bit line voltage REFBLX. Since the resistance and capacitance of the array bit lines and the reference bit lines are closely matched, the unity gain reference driver 32 serves to buffer the reference bit line and supplies a 1-to-1 voltage translation with minimal phase lag to the differential pair amplifier 26. The bandgap generator 34 is used to produce a very stable bandgap reference derived voltage BGR on line 125 corresponding to a midpoint of the reference bit line voltage REFBLX while the reference bit line is being discharged.

The reference bit line voltage level detector 28 has a first input on line 126 for receiving the reference bit line voltage REFBLX and has a second input on line 128 for receiving the bandgap reference derived voltage BGR. The level detector 28 generates a one-shot pulse signal STROBE on its output on line 130 when the reference bit line voltage REFBLX has discharged down to the bandgap reference derived voltage BGR during the read operation in order to turn on the latch 27. The reference selection circuit 30 has a first input on line 132 for also receiving the reference bit line voltage REFBLX and has a second input on line 134 for also receiving the bandgap reference derived voltage BGR. The reference selection circuit 30 also has a third input on line 136 for receiving a read enable signal READ and a fourth input on line 138 for receiving a program enable signal PGM. Dependent upon whether the read enable signal or program enable signal is active, the output of the reference selection circuit 30 on line 140 will selectively produce either the bandgap reference derived voltage BGR or the reference bit line voltage REFBLX.

The differential pair amplifier 26 functioning as a comparator has its non-inverting input connected to receive either the bandgap reference derived voltage BGR or the bit line reference voltage REFBLX and its inverting input connected to receive the array bit line voltage BL. The differential amplifier 26 consists of a sense amplifier and has its output driving the latch 27. The output of the latch 27 stores a logic "1" or "0" dependent upon whether the bit line signal BL is lower or higher than the reference bit line signal REFBLX during the read operation.

The novel read method referred to as a "bit line discharge" method for the two bits-per-cell memory array 112 of FIG. 3 will now be described with reference to FIGS. 2 and 4. For the purposes of illustration, it is assumed that it is desired to read the memory core cell $MC_{11}$ which has been previously programmed to a logic "00" or voltage level PGMVT3, as shown in FIG. 2. Further, it is assumed that the reference core cells $RC_{11}$, $RC_{12}$ and $RC_{13}$ have been programmed previously to their respective reference levels REFVT1, REFVT2, and REFVT3. In addition, a bit line pre-charge circuit 36 is used to precharge the selected array bit line via the Y-pass gate circuit 20 and the associated reference bit line via the reference Y-select circuit 24 to the same potential (i.e., +1.8 V) prior to the start of the read operation. This is illustrated by the waveforms A (array bit line BL) and B (reference bit line REFBLX) in FIG. 4 at time t0. These bit lines are then left floating by turning off the precharge devices.

Shortly thereafter, at time t1 the wordline voltage on the wordline $WL_1$ is allowed to ramp up at a speed which is at least ten times slower than the RC time constant of the array bit line. This function is accomplished by the wordline risetime control circuit 17 in FIG. 1. This is done so that all of the cells on the wordline will see the same potential at a given time, notwithstanding its location within the memory core array 112. When the wordline voltage on the gates of the array core transistor $Q_{P11}$ and the selected one of the reference core transistors $Q_{R11}$ through $Q_{R13}$ exceeds its threshold voltage, the respective array bit line and reference bit line will begin to discharge, as shown at times t2 and t3, respectively. Since the bit line paths are designed to be identical with respect to their resistance and capacitance, the rate of discharge of the array and reference bit lines will be dependent strictly upon the threshold voltages of the array core cell and reference core cell, respectively. The differential amplifier 26 will compare the threshold voltage of the core cell being read with respect to the threshold voltage of the selected reference cell and latches a logic "1" or "0," dependent upon which is higher. At time t4, an external signal REL will be discharged to zero. Thereafter, when the reference bit line voltage REFBLX discharges halfway down at time t4a, the reference bit line level detector 28 will generate the signal STROBE on line 130 so as to turn on the latch 127. A window of approximately 50 ns (between times t4a and t6) is generated during which time the latching of the output of the differential amplifier 26 into the latch 27 must occur (e.g., time t5).

The page buffer 38 is also used during the page programming operation. A program verify operation is performed simultaneously while the page programming is in progress. An extended NOR gate circuit 40 is used for generating a signal VERIFY on line 41 which goes to a high logic level when the whole page has been verified. The details of the circuits and operations thereof for the page buffer 38 and NOR gate circuit 40 are described and illustrated in co-pending application Ser. No. 08/669,116 filed Jun. 24, 1996 and entitled "A Multiple Bits-Per-Cell Flash Shift Register Page Buffer," (attorney Docket No. 95A-1788) which is assigned to the same assignee as the present invention.

Figure 4:
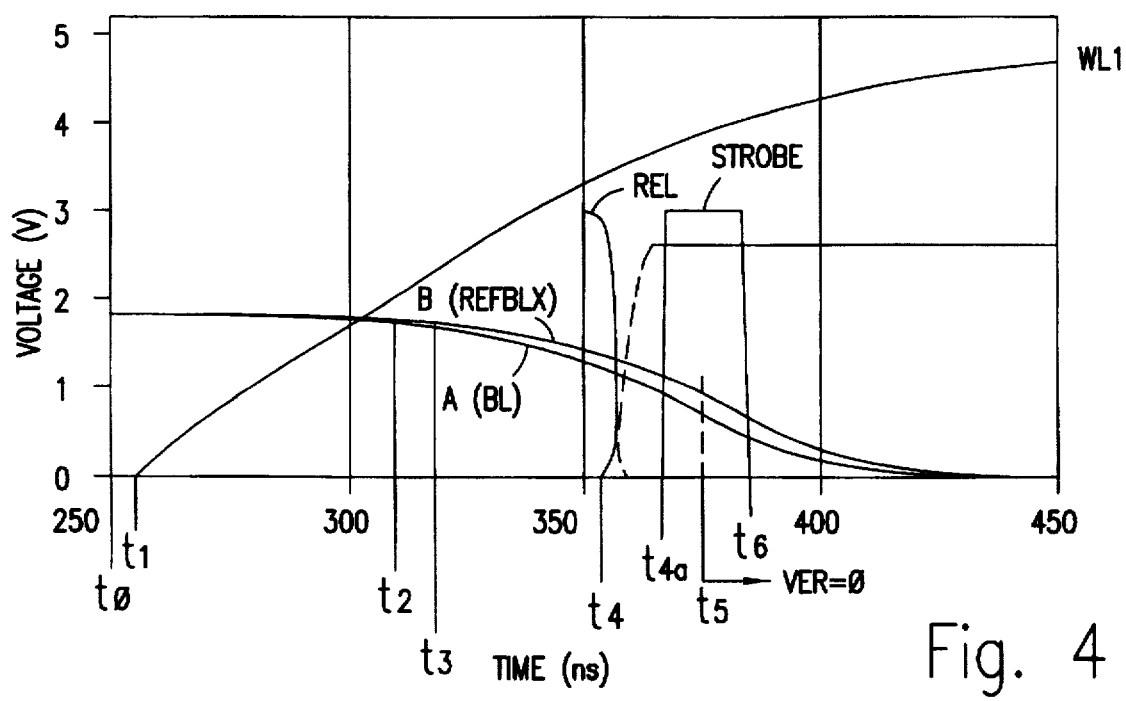
FIG. 4 shows the waveforms of various signals in FIG. 3, useful in understanding the read operation of the present invention.

In this example illustrated in FIG. 4, since the array bit line voltage BL is less than the reference bit line voltage REFBLX, the output of the differential amplifier 26 will be high and a logic "0" will be stored in the latch 27 during this particular read operation. The information of the latch is then later clocked into the shift register of a page buffer 38. By using this novel method of reading, very small differences in the threshold voltages of the array cell and the reference cell (i.e., less than 50 mV) can be reliably and accurately detected.

For the two bits-per-cell core cell $MC_{11}$, the above-described read operation is performed three times in order to determine if a logic state "00," "01," "10," or "11" is being stored. During the first read operation, by first selecting the reference voltage REFVT2 programmed into the reference cell $RC_{12}$ to be used as the reference voltage REFBLX by the reference Y-select circuit 24, the latch 27 will store a logic "1" since the programmed voltage PGMVT3 is higher than the second reference voltage REFVT2. During a second read operation, the reference voltage REFVT1 programmed into the reference cell $RC_{11}$, is selected to be used as the reference voltage REFBLX by the reference Y-select circuit 24. As a result, the latch will again store a logic "1" since the programmed voltage PGMVT3 is higher than the reference voltage REFVT1. Finally, during a third read operation, the reference voltage REFVT3 is selected by the reference Y-select circuit 24 to be used as the reference voltage REFBLX. Thus, the latch 27 will store a logic "1" during this third read operation since the programmed voltage PGMVT3 is greater than the reference voltage REFVT3.

It should be apparent to those skilled in the art that the improved read circuitry 110 of the present invention, while described with respect to a two bits-per-cell memory core array, is also applicable to multiple bits-per-cell memory core arrays storing more than two bits of data per cell. In particular, each of the memory core cells would then be programmed to any multiple number of threshold levels so that each cell can store any number of bits of information.

From the foregoing detailed description, it can thus be seen that the present invention provides an improved read circuitry for performing a read operation in an array of two bits-per-cell flash EEPROM memory cells so as to render enhanced efficiency. The read circuitry includes reference cell transistors which are programmed at the same time as the memory core transistors are being programmed. A differential pair amplifier and latch combination is responsive to a strobe signal for comparing the threshold voltage of the selected memory core cells with each of the reference cell threshold voltages so as to determine which one of the plurality of memory states the selected memory core cell is storing.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An improved reading structure for performing a read operation in an array of multiple bits-per-cell flash EEPROM memory cells so as to render enhanced efficiency, said read structure comprising:

a memory core array (12) having a plurality of memory cells arranged in rows of wordlines and columns of bit lines intersecting said rows of wordlines, each of said memory core cells including a floating gate array transistor having its control gate connected to one of said rows of wordlines, its source connected to one of said columns of bit lines, and its drain connected to a ground potential, each of said memory core cells being previously programmed to one of a plurality of memory states defined by memory core threshold voltages;

row decoder (14) means responsive to row address signals and being operatively connected to said memory core array for selecting certain ones of said rows of wordlines;

column decoder means (16,20) responsive to column address signals and being operatively connected to said memory core array for selecting certain ones of said columns of bit lines;

reference cell array means (22) including a plurality of reference core cells arranged in rows of wordlines corresponding to the number of rows in said memory core array and in columns of reference bit lines corresponding to the number of storage levels and which are selected together with a selected core cell and providing selectively one of a plurality of reference cell bit line voltages defined by reference cell threshold voltages, each of said reference cells being previously programmed to a corresponding one of the plurality of reference cell threshold voltages at the same time as said memory core cells are being programmed;

each of said reference core cells including a reference cell transistor having its gate connected to the gates of the floating gate array transistors located in the same said rows of wordlines, its source connected to one of the columns of reference bit lines, and its drain connected to the ground potential;

pre-charging means (36) for sequentially precharging said selected array bit lines in said memory core array and one of said reference bit lines in the columns to a predetermined potential;

bandgap means (34) for generating bandgap reference derived voltages;

a reference bit line level detector (28) having a first input connected to receive said bit line voltages of said reference cells and a second input connected to receive said bandgap reference derived voltages for generating strobe signals when said bit line voltages of said reference cells have discharged down to corresponding ones of said bandgap reference derived voltages;

reading circuit means including a differential pair amplifier (26) and a latch (27) and being responsive to said strobe signals for comparing the memory core threshold voltages of said selected memory core cells with each of said reference cell threshold voltages so as to determine which one of the plurality of memory states the selected memory core cell is storing;

said differential pair amplifier having an inverting input coupled to said selected array bit line and a non-inverting input coupled to said reference bit line for comparing said memory core threshold voltage and said reference cell threshold voltage, and an output;

said latch having an input connected to the output of said differential pair amplifier and an output providing a logic signal, said latch being turned on only when said strobe signals are generated by said reference bit line voltage level detector so as to store the output of said differential pair amplifier; and said latch storing said logic signal which is at a low logic level when said memory core threshold voltage of said selected memory core cells is less than said reference core threshold voltage and which is at a high logic level when said memory core threshold voltage is greater than said reference cell threshold voltage.

2. An improved reading structure as claimed in claim 1, wherein a number of said columns of said bit lines are grouped together so as to define a page.

3. An improved reading structure as claimed in claim 2, wherein a plurality of reference cell array means are provided so as to correspond to the number of pages.

4. An improved reading structure as claimed in claim 1, wherein the output of said latch is coupled to an output terminal for providing the logic signal.

5. An improved reading structure for performing a read operation in an array of two bits-per-cell flash EEPROM memory cells so as to render enhanced efficiency, said read structure comprising:

a memory core array (12) having a plurality of memory cells arranged in rows of wordlines and columns of bit lines intersecting said rows of wordlines, each of said memory core cells including a floating gate array transistor having its control gate connected to one of said rows of wordlines, its source connected to one of said columns of bit lines, and its drain connected to a ground potential, each of said memory core cells being previously programmed to one of three memory states defined by memory core threshold voltages;

row decoder means (14) responsive to row address signals and being operatively connected to said memory core array for selecting certain ones of said rows of wordlines;

column decoder means (16,20) responsive to column address signals and being operatively connected to said memory core array for selecting certain ones of said columns of bit lines;

reference cell array means (22) including a plurality of reference core cells arranged in rows of wordlines corresponding to the number of rows in said memory core array and in columns of reference bit lines corresponding to the three memory states and which are selected together with a selected core cell and providing selectively one of three reference cell bit line voltages defined by reference cell threshold voltages, each of said reference cells being previously programmed to a corresponding one of the three reference cell threshold voltages at the same time as said memory core cells are being programmed;

each of said reference core cells including a reference cell transistor having its gate connected to the gates of the floating gate array transistors located in the same said rows of wordlines, its source connected to one of the columns of reference bit lines, and its drain connected to the ground potential;

pre-charging means (36) for sequentially pre-charging said selected array bit lines in said memory core array and one of said reference bit lines in the columns to a predetermined potential;

bandgap means (34) for generating bandgap reference derived voltages;

a reference bit line level detector (28) having a first input connected to receive states of said bit line voltages of said three reference cells and a second input connected to receive said bandgap reference derived voltages for generating strobe signals when said bit line voltages of said reference cells have discharged down to corresponding ones of said bandgap reference derived voltages;

reading circuit means including a differential pair amplifier (26) and a latch (27) and being responsive to said strobe signals for comparing the memory core threshold voltages of said selected memory core cells with each of said three reference cell threshold voltages so as to determine which one of the three memory states the selected memory core cell is storing;

said differential pair amplifier having an inverting input coupled to said selected array bit line and a non-inverting input coupled to said reference bit line for comparing said memory core threshold voltage and said reference cell threshold voltage, and an output;

said latch having an input connected to the output of said differential pair amplifier and an output providing a logic signal, said latch being turned on only when said strobe signals are generated by said reference bit line voltage level detector so as to store the output of said differential pair amplifier; and said latch storing said logic signal which is at a low logic level when said memory core threshold voltage of said selected memory core cells is less than said reference core threshold voltage and which is at a high logic level when said memory core threshold voltage is greater than said reference cell threshold voltage.

6. An improved reading structure as claimed in claim 5, wherein a number of said columns of said bit lines are grouped to gether so as to define a page.

7. An improved reading structure as claimed in claim 6, wherein a plurality of reference cell array means are provided so as to correspond to the number of pages.

8. An improved reading structure as claimed in claim 7, wherein the output of said latch is coupled to an output terminal for providing the logic signal.

9. A method for performing a read operation in an array of multi-density flash EEPROM memory cells so as to render enhanced efficiency, said method comprising the steps of:

providing a memory core array having a plurality of memory cells arranged in rows of wordlines and columns of bit lines intersecting the rows of wordlines, each of the memory core cells being previously programmed to one of a plurality of memory conditions defined by memory core threshold voltages;

providing a reference cell array including a plurality of reference core cells arranged in rows of wordlines corresponding to the number of rows in the memory core array and in columns of reference bit lines corresponding to the number of storage levels and which are selected together with a selected core cell and providing selectively one of a plurality of reference cell bit line voltages defined by reference cell threshold voltages, each of the reference cells being previously programmed to the reference cell threshold voltages at the same time as the memory core cells are being programmed;

precharging sequentially the array bit lines and one of the reference bit lines in the columns to a predetermined voltage potential;

generating a strobe signal in response to the discharging of the selected reference bit line to a pre-selected level;

comparing the memory threshold voltage of the selected memory core cells with each of the reference cell threshold voltages so as to determine which one of the plurality of memory conditions the selected memory core cell is storing; and storing a logic signal which is at a low logic level when the memory core threshold voltage of the selected memory core cell is less than the reference cell threshold voltage and which is at a high logic level when the memory core threshold voltage is greater than the reference cell threshold voltage only when the strobe signal has been generated.

* * * * *

UNITED STATES PATENT AND TRADEMARK OFFICE
CERTIFICATE OF CORRECTION

PATENT NO. : 5,754,475
DATED : May 19, 1998
INVENTOR(S) : Colin S. Bill et al.

It is certified that error appears in the above-indentified patent and that said Letters Patent is hereby corrected as shown below:

Column 12, line 53, cancel "to gether", insert therefor
-- together --.

Signed and Sealed this

Eleventh Day of August 1998

Attest:

BRUCE LEHMAN

*Attesting Officer*  *Commissioner of Patents and Trademarks*